(12) United States Patent
Kim et al.

(10) Patent No.: US 11,967,542 B2
(45) Date of Patent: Apr. 23, 2024

(54) PACKAGING SUBSTRATE, AND SEMICONDUCTOR DEVICE COMPRISING SAME

(71) Applicant: ABSOLICS INC., Covington, GA (US)

(72) Inventors: Sungjin Kim, Suwanee, GA (US); Youngho Rho, Daejeon (KR); Jincheol Kim, Hwaseong-si (KR); Byungkyu Jang, Suwon-si (KR)

(73) Assignee: Absolics Inc., Covington, GA (US)

( * ) Notice: Subject to any disclaimer, the term of this patent is extended or adjusted under 35 U.S.C. 154(b) by 423 days.

(21) Appl. No.: 17/433,338

(22) PCT Filed: Mar. 12, 2020

(86) PCT No.: PCT/KR2020/003481
§ 371 (c)(1),
(2) Date: Aug. 24, 2021

(87) PCT Pub. No.: WO2020/185021
PCT Pub. Date: Sep. 17, 2020

(65) Prior Publication Data
US 2022/0148942 A1 May 12, 2022

Related U.S. Application Data

(60) Provisional application No. 62/816,984, filed on Mar. 12, 2019.

(51) Int. Cl.
*H01L 23/46* (2006.01)
*H01L 23/15* (2006.01)
(Continued)

(52) U.S. Cl.
CPC ............ *H01L 23/481* (2013.01); *H01L 23/15* (2013.01); *H01L 23/49822* (2013.01); *H01L 23/49827* (2013.01)

(58) Field of Classification Search
CPC . H01L 23/481; H01L 23/15; H01L 23/49827; H01L 21/486
See application file for complete search history.

(56) References Cited

U.S. PATENT DOCUMENTS 4,835,598 A 5/1989 Higuchi et al.
5,304,743 A 4/1994 Sen et al.
(Continued)

FOREIGN PATENT DOCUMENTS

CN 1317163 A 10/2001
CN 1614464 A 5/2005
(Continued)

OTHER PUBLICATIONS

U.S. Appl. No. 17/433,342, filed Aug. 24, 2021, Kim et al., Absolics Inc.
(Continued)

*Primary Examiner* — David A Zarneke
(74) *Attorney, Agent, or Firm* — NSIP Law

(57) ABSTRACT

The embodiment relates to a packaging substrate and a semiconductor device, including an element unit including a semiconductor element; and a packaging substrate electrically connected to the element unit; and it applies a glass substrate as a core of the packaging substrate, thereby can significantly improve electrical properties such as a signal transmission rate by connecting the semiconductor element and a motherboard to be closer to each other so that electrical signals are transmitted through as short a path as possible. Therefore, it can significantly improve electrical properties such a signal transmission rate, substantially prevent generating of parasitic element, and simplify a process of treatment for an insulating layer, and thus provides a packaging substrate applicable to a high-speed circuit.

10 Claims, 8 Drawing Sheets

(51) Int. Cl.
  *H01L 23/48* (2006.01)
  *H01L 23/498* (2006.01)

(56) References Cited

U.S. PATENT DOCUMENTS

| | | | |
|---|---|---|---|
| 5,414,222 | A | 5/1995 | Sen et al. |
| 6,610,934 | B2 | 8/2003 | Yamaguchi et al. |
| 8,774,580 | B2 | 7/2014 | Bolle |
| 9,167,694 | B2 | 10/2015 | Sundaram et al. |
| 9,263,370 | B2 | 2/2016 | Shenoy et al. |
| 9,420,708 | B2 | 8/2016 | Hibino et al. |
| 9,768,090 | B2 | 9/2017 | Liang et al. |
| 10,483,210 | B2 | 11/2019 | Gross et al. |
| 2002/0093120 | A1 | 7/2002 | Magni et al. |
| 2002/0180015 | A1 | 12/2002 | Yamaguchi et al. |
| 2006/0179341 | A1 | 8/2006 | Harrod |
| 2006/0182556 | A1 | 8/2006 | Liu et al. |
| 2006/0202322 | A1 | 9/2006 | Kariya et al. |
| 2006/0226094 | A1 | 10/2006 | Cho et al. |
| 2008/0017407 | A1 | 1/2008 | Kawano |
| 2008/0217761 | A1 | 9/2008 | Yang et al. |
| 2009/0117336 | A1 | 5/2009 | Usui et al. |
| 2010/0224524 | A1 | 9/2010 | Yuasa et al. |
| 2012/0106117 | A1 | 5/2012 | Sundaram et al. |
| 2012/0153463 | A1 | 6/2012 | Maeda |
| 2012/0186866 | A1 | 7/2012 | Mikado et al. |
| 2013/0050227 | A1 | 2/2013 | Petersen et al. |
| 2013/0069251 | A1 | 3/2013 | Kunimoto et al. |
| 2013/0293482 | A1 | 11/2013 | Burns et al. |
| 2014/0034374 | A1 | 2/2014 | Cornejo et al. |
| 2014/0085847 | A1 | 3/2014 | Takizawa |
| 2014/0116763 | A1 | 5/2014 | Sato et al. |
| 2014/0116767 | A1 | 5/2014 | Sato et al. |
| 2014/0326686 | A1 | 11/2014 | Li et al. |
| 2015/0027757 | A1 | 1/2015 | Shin et al. |
| 2015/0235915 | A1 | 8/2015 | Liang et al. |
| 2015/0235936 | A1 | 8/2015 | Yu et al. |
| 2015/0235989 | A1 | 8/2015 | Yu et al. |
| 2015/0245486 | A1 | 8/2015 | Shin et al. |
| 2016/0111380 | A1 | 4/2016 | Sundaram et al. |
| 2016/0286660 | A1 | 9/2016 | Gambino et al. |
| 2016/0300740 | A1 | 10/2016 | Xu |
| 2016/0351545 | A1 | 12/2016 | Hong et al. |
| 2017/0040265 | A1 | 2/2017 | Park et al. |
| 2017/0064835 | A1 | 3/2017 | Ishihara et al. |
| 2017/0144844 | A1 | 5/2017 | Dong |
| 2017/0154860 | A1 | 6/2017 | Hareyama |
| 2017/0179013 | A1 | 6/2017 | Kunimoto |
| 2017/0186710 | A1 | 6/2017 | Yoon et al. |
| 2017/0223825 | A1 | 8/2017 | Thadesar et al. |
| 2017/0363580 | A1 | 12/2017 | Ahmad et al. |
| 2018/0068868 | A1 | 3/2018 | Jaramillo et al. |
| 2018/0139844 | A1 | 5/2018 | You |
| 2018/0226351 | A1 | 8/2018 | Park et al. |
| 2018/0240778 | A1 | 8/2018 | Liu et al. |
| 2018/0342450 | A1 | 11/2018 | Huang et al. |
| 2018/0342451 | A1 | 11/2018 | Dahlberg et al. |
| 2019/0269013 | A1 | 8/2019 | Takagi et al. |
| 2023/0062692 | A1 | 3/2023 | Park |

FOREIGN PATENT DOCUMENTS

| | | |
|---|---|---|
| CN | 101039549 A | 9/2007 |
| CN | 101189921 A | 5/2008 |
| CN | 101371355 A | 2/2009 |
| CN | 101415626 A | 4/2009 |
| CN | 102097330 A | 6/2011 |
| CN | 102106198 A | 6/2011 |
| CN | 102122691 A | 7/2011 |
| CN | 102246299 A | 11/2011 |
| CN | 102844857 A | 12/2012 |
| CN | 103188866 A | 7/2013 |
| CN | 103208480 A | 7/2013 |
| CN | 106029286 A | 10/2016 |
| CN | 106449574 A | 2/2017 |
| CN | 107112297 A | 8/2017 |
| CN | 107683524 A | 2/2018 |
| CN | 107758041 A | 3/2018 |
| CN | 107848878 A | 3/2018 |
| CN | 108878343 A | 11/2018 |
| CN | 109411432 A | 3/2019 |
| EP | 0 526 456 B1 | 8/1998 |
| EP | 1 988 758 A1 | 11/2008 |
| EP | 3 083 125 B1 | 10/2016 |
| JP | 2000-142876 A | 5/2000 |
| JP | 2001-7531 A | 1/2001 |
| JP | 3173250 B2 | 3/2001 |
| JP | 2004-311919 A | 11/2004 |
| JP | 2005-235497 A | 9/2005 |
| JP | 2007-80720 A | 3/2007 |
| JP | 2007-227967 A | 9/2007 |
| JP | 2007-281251 A | 10/2007 |
| JP | 2007-281252 A | 10/2007 |
| JP | 3998984 B2 | 10/2007 |
| JP | 2007-291396 A | 11/2007 |
| JP | 4012375 B2 | 11/2007 |
| JP | 2009-295862 A | 12/2009 |
| JP | 2010-80679 A | 4/2010 |
| JP | 2011-228495 A | 11/2011 |
| JP | 2013-38374 A | 2/2013 |
| JP | 2013-537723 A | 10/2013 |
| JP | 2014-45026 A | 3/2014 |
| JP | 2014-72205 A | 4/2014 |
| JP | 2014-127701 A | 7/2014 |
| JP | 2014-139963 A | 7/2014 |
| JP | 2014-236029 A | 12/2014 |
| JP | 2015-18675 A | 1/2015 |
| JP | 2015-70189 A | 4/2015 |
| JP | 2015-80800 A | 4/2015 |
| JP | 2015-95590 A | 5/2015 |
| JP | 2015-103586 A | 6/2015 |
| JP | 2016-18831 A | 2/2016 |
| JP | 2016-34030 A | 3/2016 |
| JP | 2016-111221 A | 6/2016 |
| JP | 2016-136615 A | 7/2016 |
| JP | 2016-213253 A | 12/2016 |
| JP | 2016-213466 A | 12/2016 |
| JP | 2016-225620 A | 12/2016 |
| JP | 2017-5174 A | 1/2017 |
| JP | 2017-41645 A | 2/2017 |
| JP | 2017-50315 A | 3/2017 |
| JP | 2017-510531 A | 4/2017 |
| JP | 6110437 B2 | 4/2017 |
| JP | 2017-112209 A | 6/2017 |
| JP | 2017-121648 A | 7/2017 |
| JP | 2018-120902 A | 8/2017 |
| JP | 2017-216398 A | 12/2017 |
| JP | 6273873 B2 | 2/2018 |
| JP | 2018-107256 A | 7/2018 |
| JP | 2018-107423 A | 7/2018 |
| JP | 2018-116951 A | 7/2018 |
| JP | 2018-160697 A | 10/2018 |
| JP | 2018-163901 A | 10/2018 |
| JP | 2018-163986 A | 10/2018 |
| JP | 2018-174189 A | 11/2018 |
| JP | 2018-174190 A | 11/2018 |
| JP | 2018-199605 A | 12/2018 |
| JP | 2019-16672 A | 1/2019 |
| KR | 10-1997-0050005 A | 7/1997 |
| KR | 10-0184043 B1 | 5/1999 |
| KR | 10-2001-0107033 A | 12/2001 |
| KR | 10-2002-0008574 A | 1/2002 |
| KR | 20-0266536 Y1 | 2/2002 |
| KR | 10-0447323 B1 | 9/2004 |
| KR | 10-0538733 B1 | 12/2005 |
| KR | 10-2006-0111449 A | 10/2006 |
| KR | 10-0687557 B1 | 2/2007 |
| KR | 10-0720090 B1 | 5/2007 |
| KR | 10-2007-0085553 A | 8/2007 |
| KR | 10-0794961 B1 | 1/2008 |
| KR | 10-2008-0047127 A | 5/2008 |
| KR | 10-0859206 B1 | 9/2008 |
| KR | 10-0870685 B1 | 11/2008 |
| KR | 10-2010-0044450 A | 4/2010 |

(56) References Cited

FOREIGN PATENT DOCUMENTS

| | | |
|---|---|---|
| KR | 10-2010-0097383 A | 9/2010 |
| KR | 10-2011-0112974 A | 10/2011 |
| KR | 10-2012-0023120 A | 3/2012 |
| KR | 10-2012-0051992 A | 5/2012 |
| KR | 10-1160120 B1 | 6/2012 |
| KR | 10-2013-0027159 A | 3/2013 |
| KR | 10-2013-0038825 A | 4/2013 |
| KR | 10-2014-0044746 A | 4/2014 |
| KR | 10-1466582 B1 | 11/2014 |
| KR | 10-1468680 B1 | 12/2014 |
| KR | 10-1486366 B1 | 1/2015 |
| KR | 10-2015-0014167 A | 2/2015 |
| KR | 10-1531097 B1 | 6/2015 |
| KR | 10-2015-0145697 A | 12/2015 |
| KR | 10-2016-0048868 A | 5/2016 |
| KR | 10-2016-0094502 A | 8/2016 |
| KR | 10-2016-0114710 A | 10/2016 |
| KR | 10-2016-0124323 A | 10/2016 |
| KR | 10-2016-0141516 A | 12/2016 |
| KR | 10-2017-0084562 A | 7/2017 |
| KR | 10-1760846 B1 | 7/2017 |
| KR | 10-2017-0126394 A | 11/2017 |
| KR | 10-1825149 B1 | 2/2018 |
| KR | 10-1825276 B1 | 2/2018 |
| KR | 10-2018-0040498 A | 4/2018 |
| KR | 10-2018-0067568 A | 6/2018 |
| KR | 10-2018-0088599 A | 8/2018 |
| KR | 10-2018-0116733 A | 10/2018 |
| KR | 10-1903485 B1 | 10/2018 |
| KR | 10-2019-0002622 A | 1/2019 |
| KR | 10-2019-0003050 A | 1/2019 |
| KR | 10-2019-0008103 A | 1/2019 |
| KR | 10-1944718 B1 | 2/2019 |
| KR | 10-2019-0026676 A | 3/2019 |
| TW | 201929100 A | 7/2019 |
| WO | WO 2004/053983 A1 | 6/2004 |
| WO | WO 2006/050205 A2 | 5/2006 |
| WO | WO 2008/013054 A1 | 1/2008 |
| WO | WO 2008/105496 A1 | 9/2008 |
| WO | WO 2009/005492 A1 | 1/2009 |
| WO | WO 2012/061304 A1 | 5/2012 |
| WO | WO 2015/198912 A1 | 12/2015 |
| WO | WO 2016/052221 A1 | 4/2016 |
| WO | WO 2017/057645 A1 | 4/2017 |
| WO | WO 2017/188281 A1 | 11/2017 |
| WO | WO 2018/101468 A1 | 6/2018 |

OTHER PUBLICATIONS

U.S. Appl. No. 17/434,906, filed Aug. 30, 2021, Kim et al., Absolics Inc.

U.S. Appl. No. 17/433,349, filed Aug. 24, 2021, Kim et al., Absolics Inc.

International Search Report dated Jul. 1, 2020 in counterpart International Patent Application No. PCT/KR2020/003481 (2 pages in English and 2 pages in Korean).

PACKAGING SUBSTRATE, AND SEMICONDUCTOR DEVICE COMPRISING SAME

CROSS-REFERENCE TO RELATED APPLICATION

This application is a U.S. National Stage Application of International Application No. PCT/KR2020/003481, filed on Mar. 12, 2020 which claims priority to U.S. Provisional Patent Application No. 62/816,984, filed on Mar. 12, 2019, and all the benefits accruing therefrom under the priority, the content of which in their entireties are herein incorporated by reference.

FIELD

The embodiments relate to packaging substrate, and semiconductor device comprising same.

RELATED ART

In the manufacturing of electronic components, the implementation of a circuit on a semiconductor wafer is referred to as a Front-End Process (FE), and the assembly of a wafer such that it can be actually used in a product is referred to as a Back-End Process (BE). A packaging process is included in the Back-End process.

Four key technologies of the semiconductor industry that enable the rapid development of electronic products in recent years include semiconductor technology, semiconductor packaging technology, manufacturing process technology, and software technology. Semiconductor technology has been developed in various forms such as line width of a nanometer unit, which is smaller than a micrometer unit, 10 million or more cells, high-speed operation, and much heat dissipation, but technology of packaging it completely is not supported yet. Thus, the electrical performance of semiconductors may be determined by the packaging technology and the resulting electrical connection rather than the performance of the semiconductor itself.

Ceramic or resin is used as the material of a packaging substrate. In the case of a ceramic substrate such as Si substrate, it is not easy to mount a high-performance and high-frequency semiconductor element thereon due to a high resistance or high dielectric constant. In the case of a resin substrate, it is possible to mount a high-performance and high-frequency semiconductor element thereon, but there is a distinct limitation to the reduction of pitches of wirings.

Recently, research is being conducted to apply silicon or glass to a high-end packaging substrate. By forming a through-via on a silicon or glass substrate and applying a conductive material into the through-via, it is possible to shorten a length of conductive lines between an element and a motherboard, and have excellent electric characteristics.

As related art documents, there are
Korean Patent Publication No. 10-2019-0008103,
Korean Patent Publication No. 10-2016-0114710,
Korean Patent No. 10-1468680, and the like.

DISCLOSURE

Technical Problem

The objective of the embodiment is to provide a more integrated packaging substrate and a semiconductor device comprising same, by applying a glass substrate.

Technical Solution

To solve the above objective, a packaging substrate according to the embodiment includes a core layer and an upper layer, wherein the core layer includes a supporting substrate including a glass substrate with a first surface and a second surface facing each other, and comprising a core via penetrating through the first surface and the second surface; and a core distribution layer including an electrically conductive layer respectively disposed on at least a part of the first surface and the second surface, and an electrically conductive layer which electrically connects them to each other through the core via;

wherein the upper layer includes an electrically conductive layer disposed on the first surface and electrically connecting the core distribution layer and an element unit, and;

wherein an average inner diameter of a part with the minimum inner diameter within a core via formed on the glass substrate is 50 μm to 95 μm and satisfies the condition of Equation 1 below.

$$0.83 \times D_{90} \le D_{50} \le 1.25 \times D_{10} \quad \text{[Equation 1]}$$

In the Equation 1, $D_{50}$ is a value corresponding to 50% in the diameter distribution of the minimum inner diameter, $D_{90}$ is a value corresponding to 90% in the diameter distribution of the minimum inner diameter, and $D_{10}$ is a value corresponding to 10% in the diameter distribution of the minimum inner diameter.

In one embodiment, the core via may satisfy the condition of Equation 1-1 below.

$$0.88 \times D_{90} \le D_{50} \le 1.18 \times D_{10} \quad \text{[Equation 1-1]}$$

In the Equation 1-1, $D_{50}$ is a value corresponding to 50% in the diameter distribution of the minimum inner diameter, $D_{90}$ is a value corresponding to 90% in the diameter distribution of the minimum inner diameter, and $D_{10}$ is a value corresponding to 10% in the diameter distribution of the minimum inner diameter.

In one embodiment, the core via may have a first surface opening part diameter which is a diameter at an opening part in contact with the first surface and a second surface opening part diameter which is a diameter at an opening part in contact with the second surface, and a target opening part which is a larger one between the first surface opening part diameter and the second surface opening part diameter, may have an average diameter of 70 μm to 120 μm and may satisfy the condition of Equation 2 below.

$$0.9 \times D_{90} \le D_{50} \le 1.1 \times D_{10} \quad \text{[Equation 2]}$$

In the Equation 2, $D_{50}$ is a value corresponding to 50% in the diameter distribution of a target opening part, $D_{90}$ is a value corresponding to 90% in the diameter distribution of a target opening part, and $D_{10}$ is a value corresponding to 10% in the diameter distribution of a target opening part.

In one embodiment, a target opening part which is a larger one between the first surface opening part diameter and the second surface opening part diameter, may have an average diameter of 80 μm to 105 μm and may satisfy the condition of Equation 2-1 below.

$$0.92 \times D_{90} \le D_{50} \le 1.08 \times D_{10} \quad \text{[Equation 2-1]}$$

In the Equation 2-1, $D_{50}$ is a value corresponding to 50% in the diameter distribution of a target opening part, $D_{90}$ is a value corresponding to 90% in the diameter distribution of a target opening part, and $D_{10}$ is a value corresponding to 10% in the diameter distribution of a target opening part.

In one embodiment, the core via may be disposed in the number of 100 to 3000 based on a unit area (1 cm$^2$) of the glass substrate.

In one embodiment, when the entire length of the core via is 100%, a part with the minimum inner diameter may be disposed at the point of 40 to 60% based on the first opening part.

In one embodiment, the core via may be disposed at the glass substrate in a pitch of 1.2 mm or less.

In one embodiment, the core distribution layer may include a core distribution pattern, which is an electrically conductive layer electrically connecting the first surface and the second surface of the glass substrate through a through-via; and a core insulating layer surrounding the core distribution pattern.

In one embodiment, the packaging substrate may have a thickness of about 2000 μm or less.

To achieve the above objective, a semiconductor device according to the embodiment includes a semiconductor element unit where one or more semiconductor elements are disposed; and a packaging substrate electrically connected to the semiconductor element; and a motherboard electrically connected to the packaging substrate, transmitting electrical signals of the semiconductor element and external, and connecting each other;

wherein the packaging substrate is the packaging substrate above.

Effects

Packaging substrate and semiconductor device comprising same of the embodiment can significantly improve electrical properties such as a signal transmission rate by connecting the semiconductor element and a motherboard to be closer to each other so that electrical signals are transmitted through as short a path as possible.

Also, since a glass substrate applied as a core of substrate is an insulator itself, there is a lower possibility of generating parasitic element compared to a conventional silicon core, and thus it is possible to simplify a process of treatment for an insulating layer and it is also applicable to a high-speed circuit.

In addition, unlike silicon being manufactured in the form of a round wafer shape, the glass substrate is manufactured in the form of a large panel, and thus mass production is relatively easy and economic efficiency can be further improved.

DETAILED DESCRIPTION OF EXEMPLARY EMBODIMENTS

Figure 1:
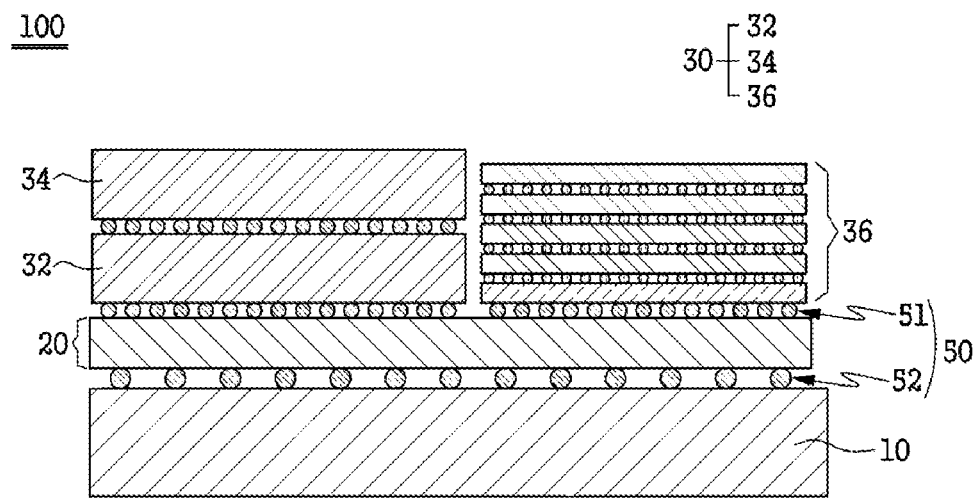
FIG. 1 is a conceptual view for illustrating a cross section of a semiconductor device according to one embodiment.

Hereinafter, examples will be described in detail with reference to the accompanying drawings so that they can be easily practiced by those skilled in the art to which the embodiment pertains. However, the embodiment may be embodied in many different forms and is not to be construed as being limited to the embodiments set forth herein. Like reference numerals designate like elements throughout the specification.

Throughout the present specification, the phrase "combination(s) thereof" included in a Markush-type expression denotes one or more mixtures or combinations selected from the group consisting of components stated in the Markush-type expression, that is, denotes that one or more components selected from the group consisting of the components are included.

Throughout the present specification, terms such as "first," "second," "A," or "B" are used to distinguish the same terms from each other. The singular forms "a," "an," and "the" include the plural form unless the context clearly dictates otherwise.

Throughout the present specification, the term "X-based" may mean that a compound includes a compound corresponding to X, or a derivative of X.

Throughout the present specification, "B being disposed on A" means that B is disposed in direct contact with A or disposed over A with another layer or structure interposed therebetween and thus should not be interpreted as being limited to B being disposed in direct contact with A.

Throughout the present specification, "B being connected to A" means that B is connected to A directly or through another element therebetween, and thus should not be interpreted as being limited to B being directly connected to A, unless otherwise noted.

Throughout the present specification, a singular form is contextually interpreted as including a plural form as well as a singular form unless specially stated otherwise.

Throughout the present specification, $D_{10}$, $D_{50}$, and $D_{90}$ are indicators to rule a particle diameter distribution. When calculating the cumulative curve of the particle size distribution with the total as 100%, this cumulative curve can refer to a particle diameter of the point at 10%, 50%, 90%, respectively.

The inventors have recognized that, in the process of developing a semiconductor device capable of exhibiting high performance with a more integrated and thinner thickness, not only the device itself but also the packaging process is an important factor for improving its performance. And while researching this, inventors have confirmed that, by applying a glass core in a single layer and controlling the shape of a through-via, an electrically conductive layer formed thereon, etc., it is possible to make a packaging substrate thinner and to improve the electrical properties of the semiconductor device, unlike a conventional interposer and organic substrate in which two or more layers of cores are applied on a motherboard as a packaging substrate, and thereby completed the invention.

Figure 2:
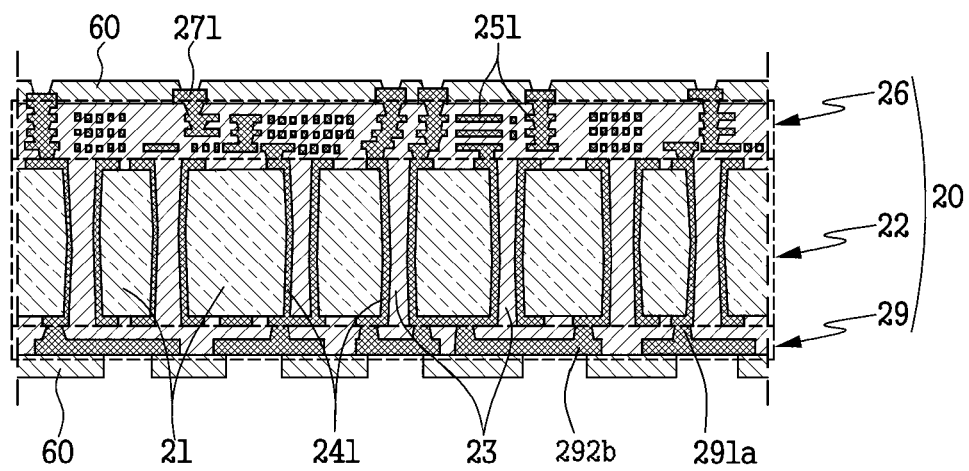
FIG. 2 is a conceptual view for illustrating a cross section of a packaging substrate according to another embodiment.
Figure 3A:
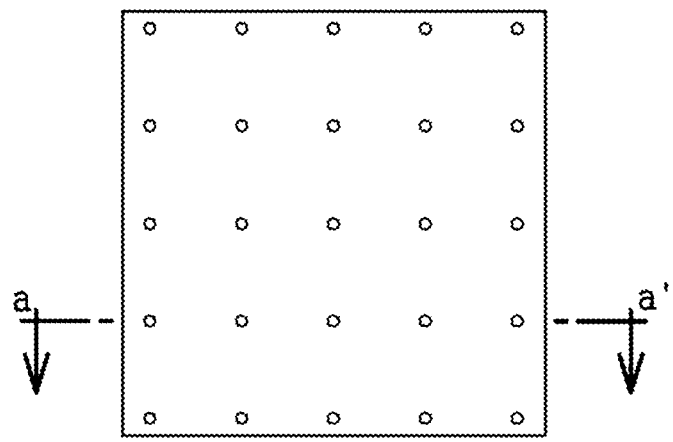
FIGS. 3A and 3B are conceptual views for illustrating a top view of a substrate where core vias are formed (FIG. 3A), and a core via by a cross section in a-a' direction (FIG. 3B).
Figure 3B:
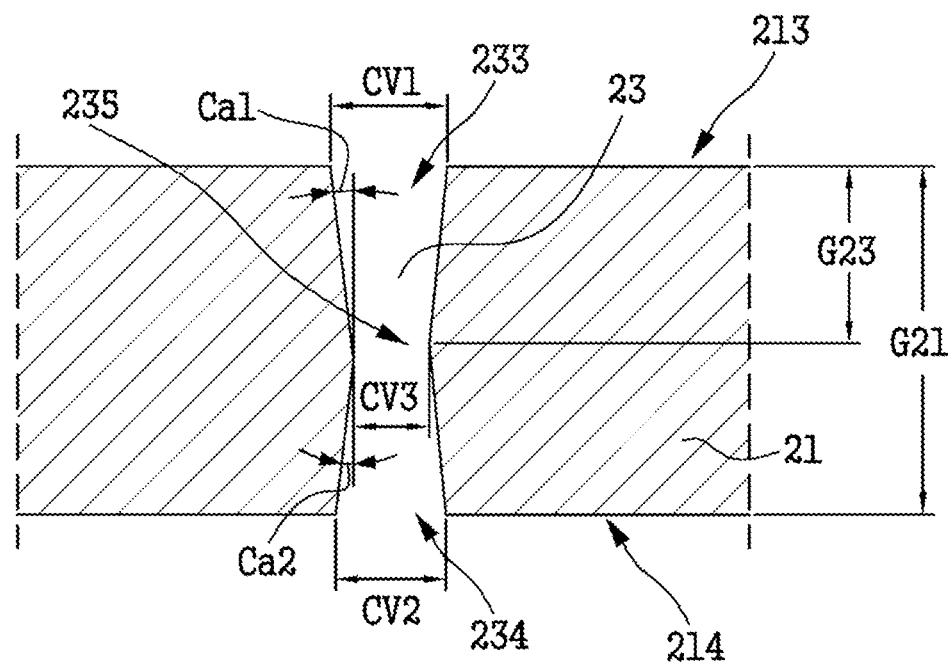
Figure 4A:
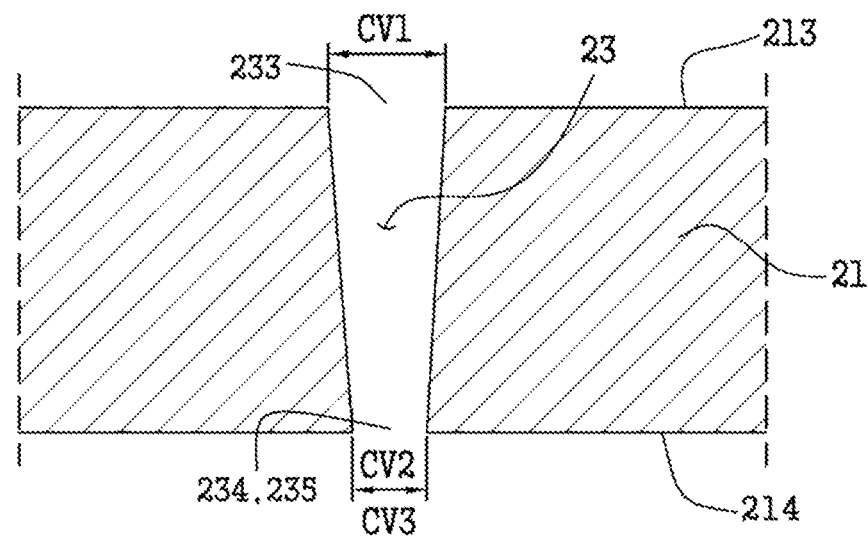
FIGS. 4A and 4B are conceptual views for illustrating a shape of cross sections of a core via applied in the embodiment, respectively.
Figure 4B:
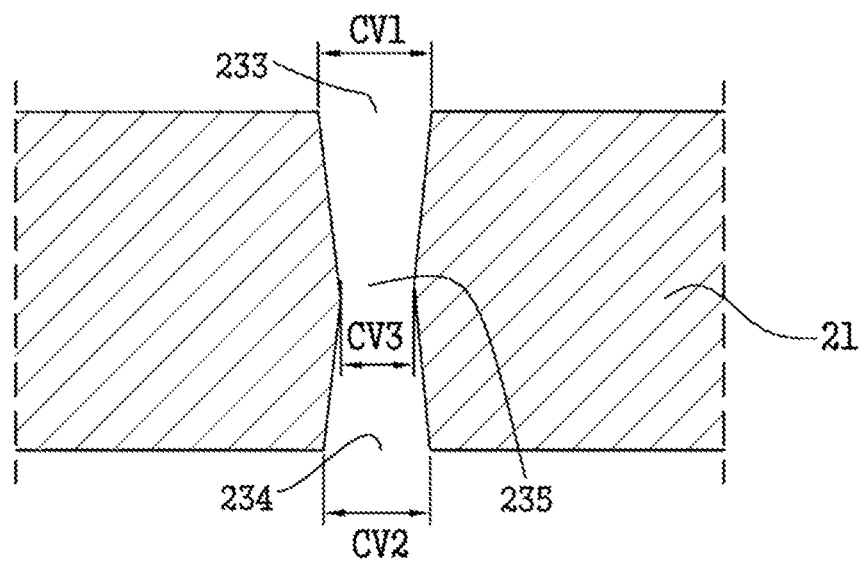
Figure 5:
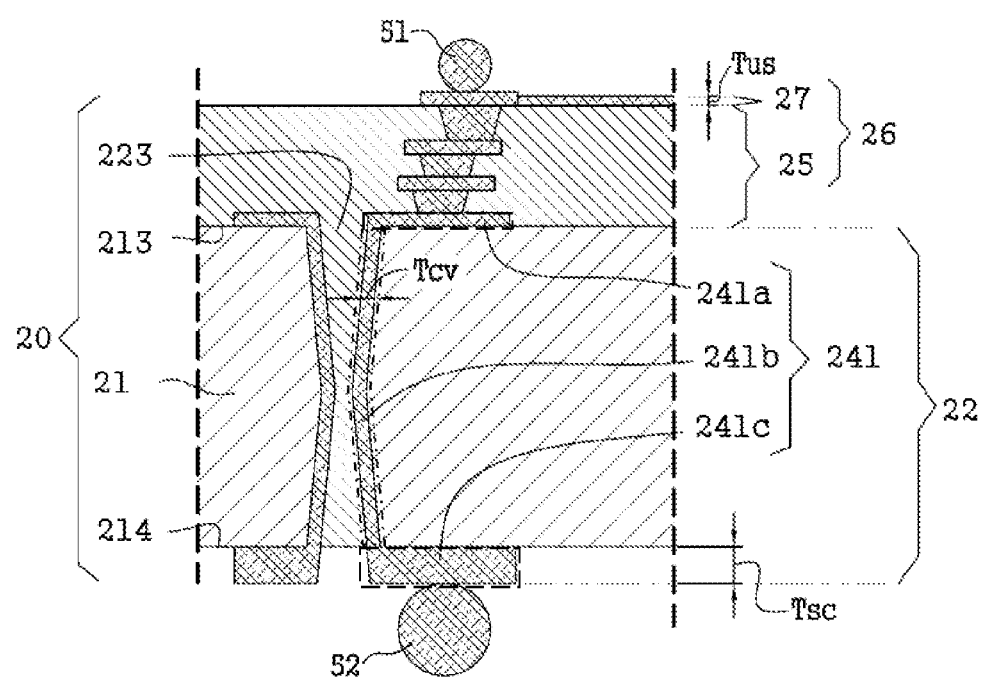
FIG. 5 and FIG. 6 are detailed conceptual views for illustrating a part of cross sections of a packaging substrate according to the embodiment, respectively.
Figure 6:
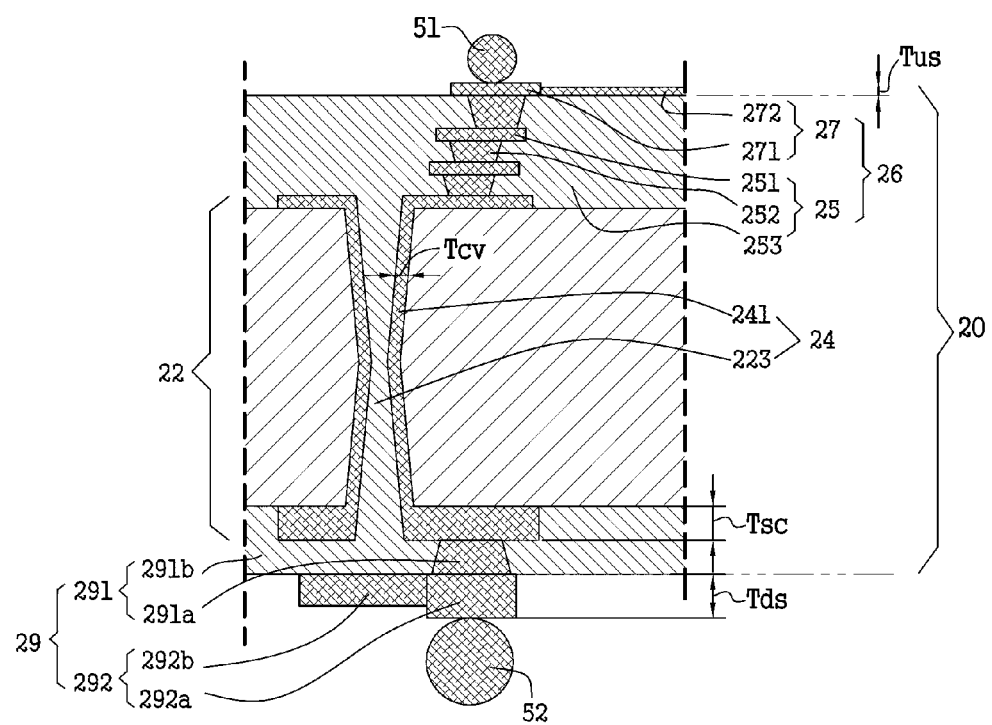
Figure 7A:
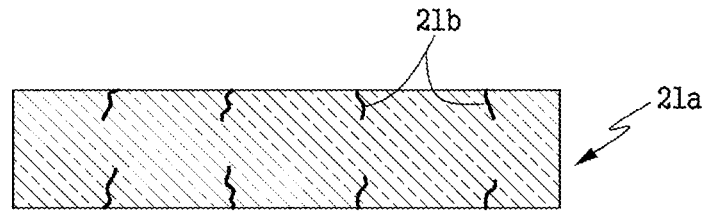
FIGS. 7A to 7E, 8A to 8E, and 9A to 9E are flowcharts for illustrating a process of manufacturing a packaging substrate by using cross sections thereof according to the embodiment.
Figure 7B:
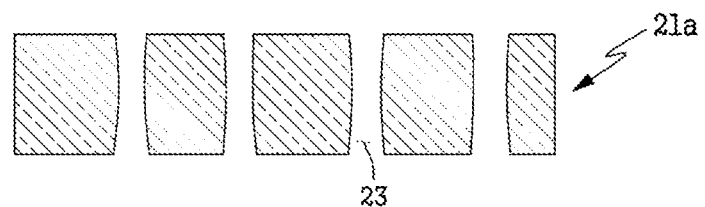
Figure 7C:
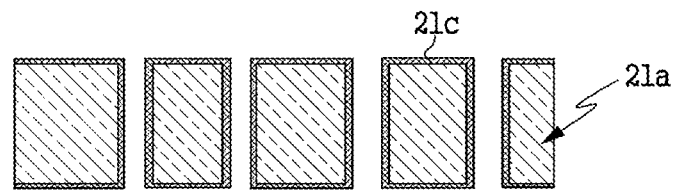
Figure 7D:
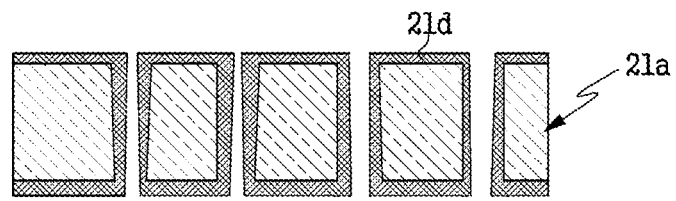
Figure 7E:
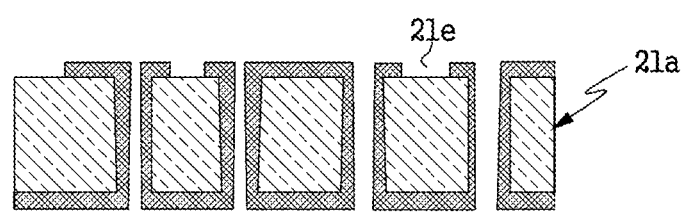
Figure 8A:
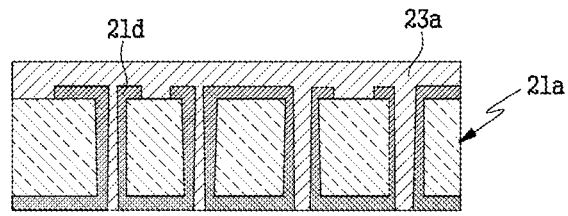
Figure 8B:
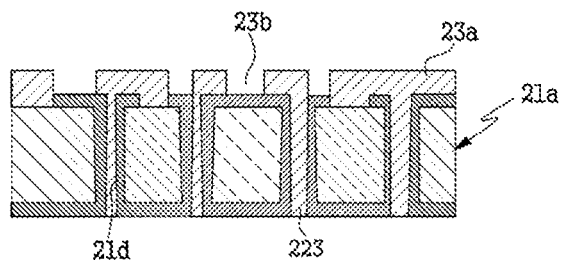
Figure 8C:
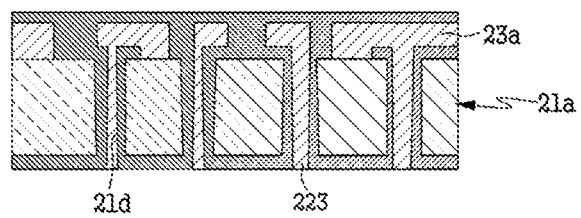
Figure 8D:
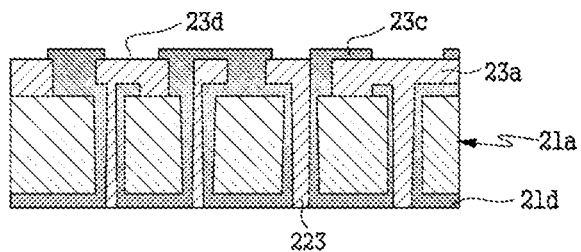
Figure 8E:
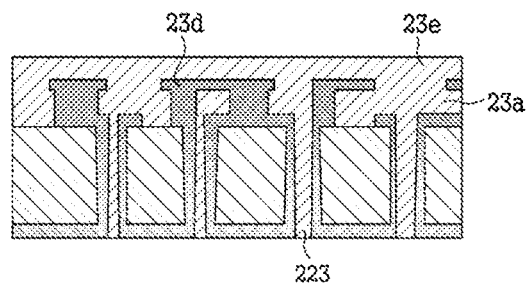
Figure 9A:
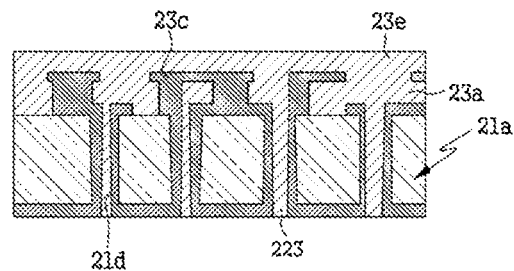
Figure 9B:
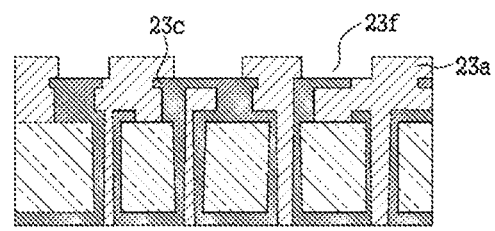
Figure 9C:
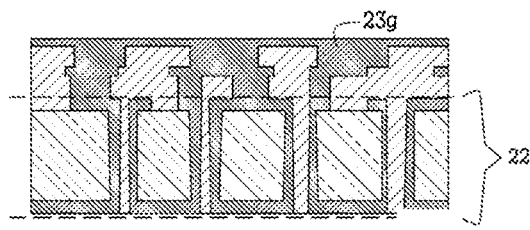
Figure 9D:
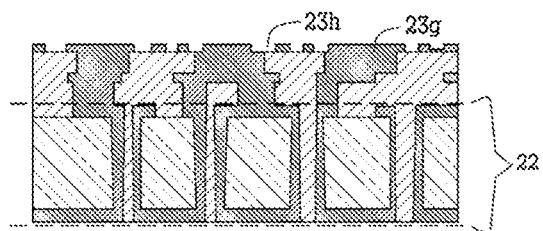
Figure 9E:
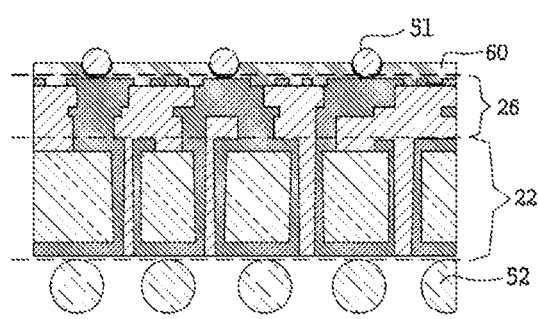

FIG. 1 is a conceptual view for illustrating a cross section of a semiconductor device according to one embodiment, FIG. 2 is a conceptual view for illustrating a cross section of a packaging substrate according to another embodiment, FIGS. 3A and 3B are conceptual views for illustrating a top view of a substrate where core vias are formed, and (b) a core via by a cross section in a-a' direction (FIG. 3B), FIGS. 4A and 4B are conceptual views for illustrating a shape of cross sections of a core via applied in the embodiment, respectively, and FIG. 5 and FIG. 6 are detailed conceptual views for illustrating a part of cross sections of a packaging substrate according to the embodiment, respectively. Hereinafter, the present disclosure will be described in more detail with reference to FIGS. 1 to 6.

To achieve the above objective, a semiconductor device 100 according to the embodiment includes a semiconductor element unit 30 where one or more semiconductor elements 32, 34, and 36 are disposed; a packaging substrate 20 electrically connected to the semiconductor element; and a motherboard 10 electrically connected to the packaging substrate, transmitting electrical signals of the semiconductor element and external, and connecting each other.

The packaging substrate 20 according to another embodiment includes a core layer 22 and an upper layer 26.

The semiconductor element unit 30 refers to the elements mounted on a semiconductor device and is mounted on the packaging substrate 20 through a connecting electrode or the like. In detail, for example, a computation element (a first element 32 and a second element 34) such as a central processing unit (CPU) and a graphics processing unit (GPU), a memory element (a third element 36) such as a memory chip, or the like may be applied as the semiconductor element unit 30, but any semiconductor element capable of being mounted on a semiconductor device may be applicable without limitation.

A motherboard such as a printed circuit board and a printed wiring board may be applied as the motherboard 10.

The packaging substrate 20 includes a core layer 22 and an upper layer 26 disposed on one surface of the core layer.

The packaging substrate 20 may further include a lower layer 29 disposed under the core layer, optionally.

The core layer 22 includes a glass substrate 21; a plurality of core via 23 penetrating through the glass substrate 21 in a thickness direction; and a core distribution layer 24 disposed on a surface of the glass substrate or a surface of the core via, and where an electrically conductive layer at least a part of which electrically connect an electrically conductive layer of the first surface and an electrically conductive layer of the second surface through the core via, is disposed.

The glass substrate 21 has a first surface 213 and a second surface 214 facing each other, and the two surfaces are substantially parallel to each other and have a substantially uniform thickness throughout the glass substrate.

A core via 23 penetrating through the first surface and the second surface is disposed at the glass substrate 21.

Conventionally, a silicon substrate and an organic substrate were applied to the packaging substrate of the semiconductor device, in a shape of being stacked. In case of a silicon substrate, when it is applied to a high-speed circuit, a parasitic element effect may occur due to its semiconductor property, and there is an advantage of relatively large power loss. Also, in case of an organic substrate, it requires a larger area to form a more complicated distribution pattern, but this does not correspond to the miniaturization trend of electronic devices. In order to form a complicated distribution pattern within a predetermined size, it is necessary to make patterns finer substantially, but there has been a practical limit to the miniaturization of the patterns due to a material property of the polymer, etc., applied to an organic substrate.

In the embodiment, the glass substrate 21 is applied as a supporting body for the core layer 22 to solve these problems. Also, by applying a glass substrate and the core via 23 formed to penetrating through the glass substrate, it is possible to provide a packaging substrate 20 having a shortened electrical flow length, a smaller size, a faster response, and a lower loss property.

As the glass substrate 21, a glass substrate applied to semiconductor can be applied. For example, a borosilicate glass substrate, a non-alkali glass substrate, or the like may be applicable, but the present disclosure is not limited thereto.

The glass substrate 21 may have a thickness of 1,000 μm or less, 100 to 1,000 μm, or 100 to 700 μm. More specifically, the glass substrate 21 may have a thickness of 100 to 500 μm. Although applying a thinner packaging substrate is advantageous in that electrical signal transmission can be made more efficient, but the packaging substrate also should serve as a supporting body of packaging, so it is preferable to apply the glass substrate 21 having the above thickness. Here, the thickness of the glass substrate may be the thickness of the glass substrate itself except for the thickness of an electrically conductive layer on the glass substrate.

The core via 23 may be formed by removing a predetermined region of the glass substrate 21. In particular, it may be formed by etching a glass plate physically and/or chemically.

In detail, the core via 23 may be formed by applying a method of forming a defect (flaw) on the surface of the glass substrate by means of a laser or the like and then chemical etching, laser etching, or the like, but the present disclosure is not limited thereto.

The core via 23 includes a first opening part 233 in contact with the first surface; a second opening part 234 in contact with the second surface; and a minimum inner diameter part 235 having the smallest inner diameter in the entire core via connecting the first opening part and the second opening part.

A diameter CV1 of the first opening part and a diameter CV2 of the second opening part may substantially differ, or a diameter CV1 of the first opening part and a diameter CV2 of the second opening part may be substantially equal.

The minimum inner diameter part may be disposed in the first opening part or the second opening part. In this case, a core via may be a cylindrical-type or a (truncated) trigonal-pyramid-type. In this case, a diameter CV3 of the minimum inner diameter part corresponds to a diameter of the smaller one between the first opening part and the second opening part.

The minimum inner diameter part may be disposed between the first opening part and the second opening part. In this case, the core via may be a barrel-type core via. In this case, the diameter CV3 of the minimum inner diameter part may be smaller than a larger one between a diameter of the first opening part and a diameter of the second opening part.

The core distribution layer 24 includes a core distribution pattern 241, which is an electrically conductive layer electrically connecting the first surface and the second surface of the glass substrate through a through-via, and a core insulating layer 223 surrounding the core distribution pattern.

The core layer 22 has an electrically conductive layer formed therein through a core via and thus serves as an electrical passage crossing the glass substrate 21, connects an upper and a lower part of the glass substrate with a relatively short distance, and thereby may have properties of faster electrical signal transmission and lower loss.

The core distribution pattern 241 is a pattern that electrically connect the first surface 213 and the second surface 214 of the glass substrate through a core via 23, and, specifically, it includes a first surface distribution pattern 241a, which is an electrically conductive layer disposed on at least a part of the first surface 213, a second surface distribution pattern 241c, which is an electrically conductive layer disposed on at least a part of the second surface 214, and a core via distribution pattern 241b, which is an electrically conductive layer electrically connecting the first surface distribution pattern and the second surface distribution pattern to each other through the core via 23. As the electrically conductive layers, for example, a copper plating layer may be applicable, but the present disclosure is not limited thereto.

The glass substrate 21 serves as an intermediate role or an intermediary role, connecting a semiconductor element unit 30 and a motherboard 10 to an upper and a lower part thereof, respectively, and the core via 23 serves as a transmitting passage for electrical signals thereof, thereby facilitating signal transmission.

A shape of the core via 23 observed at the cross section may be a shape of a larger inner diameter of one opening part, and a smaller inner diameter of the other opening part, based on a thickness of a glass substrate (Please refer to FIG. 4A.), or may be a shape of general barrel-type core via in which the inner diameter of the core via becomes slightly narrower in the center part, (Please refer to FIG. 4B.).

The core via 23 includes a first opening part 233 in contact with the first surface; a second opening part 234 in contact with the second surface; and a minimum inner diameter part 235 with the smallest inner diameter in the entire core via connecting the first opening part and the second opening part.

The core via 23 has a first surface opening part diameter CV1, which is a diameter of the first surface opening part, a second surface opening part diameter CV2, which is a diameter of the second surface opening part, and a minimum inner diameter part diameter CV3, which is a diameter of the minimum inner diameter part.

In the core via 23, a diameter CV1 of the first surface opening part may be substantially equal to or different from a diameter CV2 of the second surface opening part.

The core via 22 may have one place of which diameter is smaller than other places among the inner diameter surfaces connecting the first surface opening part and the second surface opening part, and this is referred to as a minimum inner diameter.

The first surface opening part diameter and the second surface opening part diameter may be comparatively uniform in the glass substrate 21 overall. Also, in the core via, an inner diameter at the narrowest part (minimum inner diameter) may be comparatively uniform in the glass substrate 21 overall.

In detail, the minimum diameter may have an average diameter of 50 to 95

In detail, the minimum diameter may satisfy the condition of Equation 1 below.

$$0.83 \times D_{90} \leq D_{50} \leq 1.25 \times D_{10}$$ [Equation 1]

In the Equation 1, $D_{50}$ is a value corresponding to 50% in the diameter distribution of the minimum inner diameter, $D_{90}$ is a value corresponding to 90% in the diameter distribution of the minimum inner diameter, and $D_{10}$ is a value corresponding to 10% in the diameter distribution of the minimum inner diameter.

In further detail, the minimum inner diameter may have an average diameter of 55 to 85 μm, or 60 to 70 μm.

In further detail, the minimum inner diameter may satisfy the condition of Equation 1-1 below.

$$0.88 \times D_{90} \leq D_{50} \leq 1.18 \times D_{10}$$ [Equation 1-1]

In the Equation 1, $D_{50}$ is a value corresponding to 50% in the diameter distribution of the minimum inner diameter, $D_{90}$ is a value corresponding to 90% in the diameter distribution of the minimum inner diameter, and $D_{10}$ is a value corresponding to 10% in the diameter distribution of the minimum inner diameter.

In detail, a target opening part which is a larger one between the first surface opening part diameter and the second surface opening part diameter, may have an average diameter of 70 to 120 μm.

In detail, a target opening part which is a larger one between the first surface opening part diameter and the second surface opening part diameter may satisfy the condition of Equation 2 below.

$$0.9 \times D_{90} \leq D_{50} \leq 1.1 \times D_{10}$$ [Equation 2]

In the Equation 2, $D_{50}$ is a value corresponding to 50% in the diameter distribution of a target opening part, $D_{90}$ is a value corresponding to 90% in the diameter distribution of a target opening part, and $D_{10}$ is a value corresponding to 10% in the diameter distribution of a target opening part.

In detail, a target opening part which is a larger one between the first surface opening part diameter and the second surface opening part diameter, may have an average diameter of 80 to 105 μm.

In detail, a target opening part which is a larger one between the first surface opening part diameter and the second surface opening part diameter may satisfy the condition of Equation 2-1 below.

$$0.92 \times D_{90} \leq D_{50} \leq 1.08 \times D_{10}$$ [Equation 2-1]

In the Equation 2, $D_{50}$ is a value corresponding to 50% in the diameter distribution of a target opening part, $D_{90}$ is a value corresponding to 90% in the diameter distribution of a target opening part, and $D_{10}$ is a value corresponding to 10% in the diameter distribution of a target opening part.

In the core via, an average diameter of a target opening part which is a larger one between the first surface opening part diameter, which is a diameter at an opening part in contact with the first surface, and the second surface opening part diameter, which is a diameter at an opening part in contact with the second surface, may have a larger value than $D_{50}$, which is a value corresponding to 50% in the diameter distribution of a target opening part.

The diameter distribution described above, is evaluated based on a diameter which is observed and measured by microscope in the cross-section, after dividing prepared samples into 9 compartments (3×3), and processing of cutting the samples of 5 areas of top left, bottom left, center, top right, and bottom right.

When the entire length G21 of the core via is 100%, the point at which the minimum inner diameter part is located may be the point G23 of 40% to 60% based on the first opening part, and may be the point of 45% to 55%. When the minimum inner diameter part is at the position described above, based on the entire length of core via, the design of electrically conductive layer of packaging substrate and the process of forming electrically conductive layer may be easier.

The angle (Ca1) of the inner diameter surface connecting the inner diameter of the minimum inner diameter part and the first opening part, and the angle (Ca2) of the inner diameter surface connecting the inner diameter part of the minimum inner diameter part and the second opening part, may have a ratio of 1:0.7 to 1.3. In this case, since the angle difference between the inner diameter surface of the core via starting from the first opening and the inner diameter surface of the core via starting from the second opening is insignificant, the subsequent plating process, etc. may proceed more smoothly.

The angle is evaluated as an angle with an imaginary reference line perpendicular to the first surface or the second surface, and evaluated as an absolute value regardless of the direction (hereinafter the same).

A larger angle between the angle (Ca1) of the inner diameter surface connecting the inner diameter of the minimum inner diameter part and the first opening part, and the angle (Ca2) of the inner diameter surface connecting the inner diameter of the minimum inner diameter part and the second opening part, may be degree of 8 or less, may be degree of 0.1 to 8, and may be degree of 0.5 to 6.5. In the case of having such an angle, the efficiency of subsequent processes such as plating can be further improved.

A thickness of an electrically conductive layer measured at a larger one between the diameter (CV1) of the first opening part and the diameter (CV2) of the second opening part, may be same as or thicker than a thickness of an electrically conductive layer formed on a part CV3 having the minimum inner diameter among the core vias.

The core via 23 may be disposed in the number of 100 to 3000, may be disposed in the number of 100 to 2500, or may be disposed in the number of 225 to 1024 based on a unit area (1 cm×1 cm) of the glass substrate 21. When the core via satisfies the above pitch condition, the formation of an electric conductive layer, etc., and the performance of a packaging substrate can be improved.

The core via 23 may be disposed at the glass substrate 21 in a pitch of 1.2 mm or less, may be disposed in a pitch of 0.12 to 1.2 mm, may be disposed in a pitch of 0.3 to 0.9 mm. In this case, it is advantageous to form an electrically conductive layer, etc., while maintaining the mechanical properties of the glass substrate above certain level.

The core distribution layer 24 is an electrically conductive layer formed on a glass substrate, and may satisfy that a cross-cut adhesion test value according to ASTM D3359 is 4B or greater, and specifically may satisfy that the cross-cut adhesion test value is 5B or greater. Also, an electrically conductive layer which is a core distribution layer 24, may have an adhesive strength of 3 N/cm or more and a bonding strength of 4.5 N/cm or more with respect to the glass substrate 21. When such a degree of bonding strength is satisfied, it has a sufficient bonding strength between a substrate and an electrically conductive layer, to be applied as a packaging substrate.

An upper layer 26 is disposed on the first surface 213.

The upper layer 26 may include an upper distribution layer 25 and an upper surface connecting layer 27 disposed on the upper distribution layer 25, and the uppermost surface of the upper layer 26 may be protected by a cover layer 60 having an opening part formed thereon, which is capable of being in direct contact with a connecting electrode of the semiconductor element unit.

The upper distribution layer 25 includes an upper insulating layer 253 disposed on the first surface; and an upper distribution pattern 251 that has a predetermined pattern and is an electrically conductive layer at least a part of which is electrically connected to the core distribution layer 24, and built in the upper insulting layer.

Anything applied as an insulating layer to a semiconductor element or a packaging substrate, is applicable to the upper insulating layer 253, for example, an epoxy-based resin comprising a filler may be applied, but the present disclosure is not limited thereto.

The insulating layer may be formed by a method of forming and hardening a coating layer, or by a method of laminating an insulating film which is being filmed in a state of non-hardened or semi-hardened to a core layer and hardening it. In this time, when a method of pressure sensitive lamination and the like is applied, the insulator is embedded even in the space inside a core via, and thus efficient process proceeding can be made. Also, even though plural-layered insulating layers are applied with being stacked, substantial distinction between the layers may be difficult, so that a plurality of insulating layer are collectively referred to as an upper insulating layer. Also, the core insulating layer 223 and the upper insulating layer 253 may be applied with the same insulating material, and in this case, the boundary therebetween may not be substantially distinguished.

The upper distribution pattern 251 refers to an electrically conductive layer disposed in the upper insulating layer 253 in a predetermined form. For example, it may be formed by a method of a build-up layer method. In detail, the upper distribution pattern 251 where electrically conductive layer is vertically or horizontally formed in a desired pattern, may be formed by repeating a process of: forming an insulating layer, removing an unnecessary part of the insulating layer and then forming an electrically conductive layer through a method of copper plating and the like, removing an unnecessary part of the electrically conductive layer and then forming an insulating layer on this electrically conductive layer again, and removing an unnecessary part again and then forming an electrically conductive layer through a method of plating and the like.

Since the upper distribution pattern 251 is disposed between the core layer 22 and the semiconductor element unit 30, it is formed to at least partially includes a fine pattern so that the transmission of electrical signals with the semiconductor element unit 30 may proceed smoothly and a desired complicated pattern may be sufficiently accommodated. In this case, the fine pattern may have a width and an interval of about less than 4 μm, 3.5 μm or less, 3 μm or less, 2.5 μm or less, or 1 to 2.3 μm, respectively. The interval may be an interval between fine patterns neighboring to each other (Hereinafter, the description of the fine pattern is the same).

In order to form the upper distribution pattern 251 to include a fine pattern, at least two or more methods are applied in the embodiment.

One of them, is to apply a glass substrate 21, as a glass substrate 21 of a packaging substrate. The glass substrate 21 can have a considerably flat surface property with a surface roughness (Ra) of 10 angstroms or less, and thereby minimizing the influence of surface morphology of a supporting substrate on formation of the fine pattern.

The other one, is based on the property of the insulating layer. In case of the insulating layer, a filler component is often applied in addition to resin, and inorganic particles such as silica particles may be applicable as the filler. When the inorganic particles are applied to the insulating layer as the filler, the size of the inorganic particles can affect whether to form the fine pattern, and therefore, the insulating layer in the present disclosure applies particle fillers with an average diameter of about 150 nm or less, and in detail, including particle fillers with an average diameter of 1 nm to 100 nm. Such a characteristic can minimize the influence of the insulating layer itself on the formation of an electrically conductive layer with a width of several micrometer-unit, while maintaining necessary properties for the insulating layer at a certain level or more, and can also help to form a fine pattern with good adhesion onto the surface, due to the fine surface morphology.

The upper surface connecting layer 27 includes an upper surface connecting pattern 272 disposed in the upper insulating layer 253, and at least a part of which is electrically connected to the upper distribution pattern 251, and an upper surface connecting electrode 271, electrically connecting the semiconductor element unit 30 and the upper surface connecting pattern 272. The upper surface connecting pattern 272 may be disposed on one surface of the upper insulating layer 253 or may be embedded with at least a part of which is being exposed on the upper insulating layer. For example, when the upper surface connecting pattern is disposed on one side of the upper insulating layer, the upper insulating layer may be formed by a method of plating and the like, and when the upper surface connecting pattern is embedded with at least a part of which is being exposed on the upper insulating layer, it may be the one which is formed by forming a copper plating layer and the like, and then a part of an insulating layer or electrically conductive layer is removed by a method of surface polishing, surface etching and the like.

The upper surface connecting pattern 272 may at least partially include a fine pattern like the above-described upper distribution pattern 251. The upper surface connecting pattern 272 including the fine pattern like this may enable a larger number of elements to be electrically connected to one another even in a narrow area, facilitate electrical signal connection between elements or with the external, and more integrated packaging is possible.

The upper surface connecting electrode 271 may be connected to the semiconductor element unit 30 directly through a terminal and the like or via an element connecting unit 51 such as a solder ball.

The packaging substrate 20 is also connected to the motherboard 10. The motherboard 10 may be directly connected to the second surface distribution pattern 241c, which is a core distribution layer disposed on at least a part of the second surface 214 of the core layer 22, through a motherboard terminal or may be electrically connected via a board connecting unit such as a solder ball. Also, the second surface distribution pattern 241c may be connected to the motherboard 10 via the lower layer 29 disposed under the core layer 22.

The lower layer 29 includes a lower distribution layer 291 and a lower surface connecting layer 292.

The lower distribution layer 291 includes i) a lower insulating layer 291b at least a part of which is in contact with the second surface 214; and ii) a lower distribution pattern 291a being embedded in the lower insulating layer and having a predetermined pattern, and at least a part of which is electrically connected to the core distribution layer.

The lower surface connecting layer 292 includes i) a lower surface connecting electrode 292a electrically connected to the lower surface connecting pattern and may further include ii) a lower surface connecting pattern 292b at least a part of which is electrically connected to the lower distribution pattern, and at least a part of which is exposed to one surface of the lower insulating layer.

The lower surface connecting pattern 292b, which is a part connected to the motherboard 10, may be formed as a non-fine pattern wider than the fine pattern, unlike the upper surface connecting pattern 272, for more efficient transmitting of electrical signals.

Not applying a substantially additional different substrate other than the glass substrate 21 to the packaging substrate 20 disposed between the semiconductor element unit 30 and the motherboard 10, is one feature of the present disclosure.

Conventionally, an interposer and an organic substrate were applied with being stacked between connection of the element and the motherboard. It is considered that such a multi-stage form has been applied in at least two reasons. One reason is that there is a scale problem in directly bonding the fine pattern of the element to the motherboard, and the other reason is that problem of wiring damage may occur due to a difference in thermal expansion coefficient during the bonding process or during the driving process of the semiconductor apparatus. The embodiment has solved these problems by applying the glass substrate with a thermal expansion coefficient similar to that of the semiconductor element, and by forming a fine pattern with a fine scale enough to mount the elements on the first surface of the glass substrate and its upper layer.

In the embodiment, a thickness of a thinner one among electrically conductive layers of the core distribution layer 24 may be the same as or thicker than a thickness Tus of a thinner one among electrically conductive layers of the upper layer 26. When a thickness of a thinner one among electrically conductive layers of the core distribution layer 24 is the same as or thicker than the a thickness Tus of a thinner one among electrically conductive layers of the upper layer 26, electrical signal transmittance can be made more efficient between an element and a motherboard.

A thickness Tsc of a thinner one among the second surface distribution pattern 241c in the embodiment, may be thicker than a thickness Tus of a thinner one among the upper surface connecting pattern 272.

A thickness Tds of a thicker one among the lower surface connecting electrode 292a in the embodiment, may be thicker than a thickness Tsc of a thinner one among the second surface distribution pattern 241c.

The semiconductor apparatus 100 having a considerably thin packaging substrate 30 may make the overall thickness of the semiconductor apparatus thinner, and it is also possible to dispose a desired electrical connecting pattern even in a narrower area by applying the fine pattern. In detail, the packaging substrate 30 may have a thickness of about 2000 µm or less, about 1500 µm or less, or about 900 µm. Also, the packaging substrate 30 may have a thickness of about 120 µm or more, or about 150 µm or more. Due to the above-described characteristics, the packaging substrate can stably connect the element and the motherboard electrically and structurally even with a relatively thin thickness, thereby contributing to miniaturization and thinning of the semiconductor apparatus.

FIGS. 7A to 7E, 8A to 8E, and 9A to 9E are flowcharts for illustrating a process of manufacturing a packaging substrate by cross sections thereof according to an embodiment of the present disclosure. A method of manufacturing the packaging substrate according to another embodiment of the present disclosure will be described below with reference to FIGS. 7A to 7E, 8A to 8E, and 9A to 9E.

The method of manufacturing the packaging substrate of the present disclosure includes a preparation step of forming a defect at predetermined positions of a first surface and a second surface of a glass substrate; an etching step of preparing a glass substrate with a core via formed thereon by applying an etchant to the glass substrate where the defect is formed; a core layer forming step of plating the surface of the glass substrate with the core via formed thereon, to form a core distribution layer which is an electrically conductive layer, and thereby forming a core layer; and an upper layer forming step of forming an upper distribution layer, which is an electrically conductive layer surrounded by an insulting layer on one side of the core layer, and thereby manufacturing the packaging substrate described above.

The core layer forming step may include a pretreatment process of preparing a pretreated glass substrate by forming an organic-inorganic composite primer layer containing a nanoparticle with amine-group on a surface of the glass substrate where the core via is formed; and a plating process of plating a metal layer on the glass substrate which is pretreated.

The core layer forming step may include a pretreatment process of preparing a pretreated glass substrate by forming a metal-containing primer layer through sputtering on a surface of the glass substrate where the core via is formed; and a plating process of plating a metal layer on the glass substrate which is pretreated.

An insulating layer forming step may be further included between the core layer forming step and the upper layer forming step.

The insulating layer forming step may be a step of positioning an insulating film on the core layer and performing pressure sensitive lamination to form a core insulating layer.

The method of manufacturing the packaging substrate will be described in more detail.

1) Preparation Step (Glass Defect Forming Process): A glass substrate 21a having flat first surface and second surface was prepared, and a defect (groove) 21b was formed at a predetermined position on the surface of the glass substrate to form a core via. As the glass substrate, a glass substrate applied to a substrate for electronic apparatus, etc., for example, non-alkalic glass substrate, etc. is applicable, but not limited thereto. As a commercial product, product manufactured by manufacturers such as CORNING, SCHOTT, AGC may be applied. For formation of the defect (groove), a method of mechanical etching, laser irradiation, and the like can be applied.

2) Etching Step (Core Via Forming Step): On the glass substrate 21a where the defect (groove) 21b is formed, a core via 23 is formed through a physical or chemical etching process. During the etching process, the glass substrate forms vias in the parts with defect, and at the same time, the surface of the glass substrate 21a may be simultaneously etched. A masking film may be applied to prevent the etching of the glass surface, but the defective glass substrate itself may be etched in consideration of the inconvenience, etc. of the process of applying and removing the masking film, and in this case, a thickness of the glass substrate having the core via may be slightly thinner than the thickness of the first glass substrate.

Chemical etching may be proceeded by placing a glass substrate where a groove is formed, in a bath containing hydrofluoric acid and/or nitric acid, and applying ultrasonic treatment, etc. In this case, the hydrofluoric acid concentration may be 0.5 M or more, and may be 1.1 M or more. The hydrofluoric acid concentration may be 3 M or less, and may be 2 M or less. The nitric acid concentration may be 0.5 M or more, and may be 1 M or more. The nitric acid concentration may be 2 M or less. The ultrasonic treatment may be performed at a frequency of 40 Hz to 120 Hz, and may be performed at a frequency of 60 Hz to 100 Hz.

3-1) Core Layer Forming Step: An electrically conductive layer 21d is formed on the glass substrate. As for the electrically conductive layer, a metal layer containing copper metal may be applied representatively, but not limited thereto.

A surface of the glass (including a surface of a glass substrate and a surface of a core via) and a surface of the copper metal have different properties, so the adhesion strength is rather poor. In the present disclosure, the adhesion strength between the glass surface and the metal is improved by two methods, a dry method and a wet method.

The dry method is a method applying sputtering, that is, a method of forming a seed layer 21c inside the core via and on the glass surface through metal sputtering. For the formation of the seed layer, different kinds of metals such as titanium, chromium, and nickel may be sputtered with copper, etc., and in this case, it is considered that the adhesiveness of glass-metal is improved by surface morphology of glass, an anchor effect which is an interaction between metal particles, and the like.

The wet method is a method applying primer treatment, that is, a method of forming a primer layer 21c by performing pre-treatment with a compound having a functional group such as amine After pre-treatment by using a silane coupling agent depending on the degree of intended adhesion strength, primer treatment may be done with a compound or particles having an amine functional group. As mentioned above, a supporting body substrate of the present disclosure needs to be of high performance enough to form a fine pattern, and it should be maintained after the primer treatment. Therefore, when such a primer includes a nanoparticle, it is desirable to apply a nanoparticle with an average diameter of 150 nm or less, for example, a nanoparticle is desirable to be applied to a particle with amine functional group. The primer layer may be formed by applying an adhesive strength improving agent manufactured in CZ series by MEC Inc, for example.

In the seed layer/primer layer 21c, an electrically conductive layer may selectively form a metal layer in the state of removing a part where the formation of an electrically conductive layer is unnecessary, or not removing. Also, in the seed layer/primer layer 21c, a part where the formation of an electrically conductive layer is necessary, or a part where it is unnecessary, may be selectively processed to be an activated state or an inactivated state for metal plating. The processing to be an activated state or an inactivated state may be performed, for example, by using light irradiation treatment such as laser light of a certain wavelength, etc., chemical treatment, and the like. A copper plating method, etc. applied to manufacturing a semiconductor element may be applied to form the metal layer, but not limited thereto.

During the metal plating, a thickness of an electrically conductive layer formed, may be controlled by regulating several variables such as the concentration of plating solution, plating time, and type of additive to be applied.

When a part of the core distribution layer is unnecessary, it may be removed, and an etched layer 21e of a core distribution layer may be formed by performing metal plating to form an electrically conductive layer as a predetermined pattern, after the seed layer is partially removed or processed to be inactivated.

3-2) Insulating Layer Forming Step: An insulating layer forming step in which an empty space of a core via is filled with an insulating layer after the core distribution layer, which is an electrically conductive layer, is formed, may be performed. In this case, the one manufactured in a film type may be applied to the applied insulating layer, and for example, a method such as pressure sensitive laminating the film-type insulating layer may be applied. When proceeding the pressure sensitive laminating like this, the insulating layer may be sufficiently subsided to the empty space inside the core via to form a core insulating layer without void formation.

4) Upper Layer Forming Step: It is a step of forming an upper distribution layer including an upper insulating layer and an upper distribution pattern on a core layer. The upper distribution layer may be formed by a method of coating a resin composition forming an insulating layer 23a, or laminating an insulating film. For simplicity, applying a method of laminating an insulating film is desirable. The laminating of the insulating film may be proceeded by a process of laminating and then hardening, and in this case, if a method of the pressure sensitive lamination is applied, the insulating resin may be sufficiently subsided even into a layer where an electrically conductive layer is not formed inside the core via. The upper insulating layer is also in direct contact with a glass substrate at least in part thereof, and thus the one with a sufficient adhesive force is applied. Specifically, it is desirable that the glass substrate and the upper insulating layer have characteristics that satisfy an adhesion strength test value of 4B or more according to ASTM D3359.

The upper distribution pattern may be formed by repeating a process of forming the insulating layer 23a, forming an electrically conductive layer 23c to have a predetermined pattern, and forming an etched layer 23d of the electrically conductive layer by etching the unnecessary part, and in the case of an electrically conductive layer formed to neighbor with having an insulating layer disposed therebetween, it may be formed by a method of performing a plating process after forming a blind via 23b in the insulating layer. For formation of the blind via, a dry etching method such as laser etching and plasma etching, and a wet etching method using a masking layer and an etching solution may be applied.

5) Upper Surface Connecting Layer and Cover Layer Forming Step: Upper surface connecting pattern and upper surface connecting electrode may be performed by a process similar to forming the upper distribution layer. Specifically, it may be formed by a method such as forming an etched layer 23f of an insulating layer 23e on the insulating layer 23e, and then forming an electrically conductive layer 23g again thereon, and then forming an etched layer 23h of the electrically conductive layer, but a method of selectively forming only an electrically conductive layer without applying a method of etching, may be also applied. A cover layer may be formed to have an opening part (not shown) at a position corresponding to the upper surface connecting electrode such that the upper surface connecting electrode to be exposed and directly connected to an element connecting unit, a terminal of an element, or the like.

6) Lower Surface Connecting Layer and Cover Layer Forming Step: A lower distribution layer and/or a lower connecting layer, and optionally a cover layer (not shown) may be formed in a manner similar to the the upper surface connecting layer and the cover layer forming step, described above.

Hereinafter, the present disclosure will be described in more detail through specific examples. The following examples are only examples to help the understanding of the present disclosure, and the scope of the present disclosure is not limited thereto.

Example 1—Manufacturing of a Packaging Substrate

1) Preparation Step (Glass Defect Forming Process): A glass substrate 21a with a flat first surface and a flat second surface was prepared, and defects (grooves, 21b) were formed on the glass surface at a predetermined position for forming a core via. In this case, the number of defects were allowed to form in the number of 225 per 1 $cm^2$. As the glass, borosilicate glass (from CORNING) was applied. A method of mechanical etching and laser irradiation were applied to the formation of the defect (groove).

2) Etching Step (Core Via Forming Step): The core via 23 was formed on the glass substrate 21a where the defects (grooves, 21b) were formed, through a physical or chemical etching process. The etching was performed by a method of placing the glass substrate in an etching bath filled with 2 M hydrofluoric acid (HF), 1.1 M nitric acid ($HNO_3$) and deionized water, and applying ultrasonic waves at 80 Hz and 100% output.

Also, the core via were formed to have a first opening part in contact with the first surface; a second opening part in contact with the second surface; and a minimum inner diameter part, which is the area whose diameter is the narrowest in the entire core via connecting the first opening part and the second opening part.

3-1) Core Layer Forming Step: An electrically conductive layer 21d was formed on a glass substrate. As the electrically conductive layer, a metal layer containing copper metal was applied. By two methods of a dry method and a wet method, an adhesive strength between a surface of the glass substrate and a metal layer was improved. The dry method is a method applying sputtering, that is, a method of forming a seed layer 21c inside the core via and on the glass surface through metal sputtering. For the formation of the seed layer, one or more different kinds of metals from titanium, chromium, and nickel were sputtered with copper, etc. The wet method is a method applying primer treatment, that is, a method of forming a primer layer 21c by performing pre-treatment with a compound having a functional group such as amine After pre-treatment by using a silane coupling agent, primer treatment was done with a compound or particles having an amine functional group. A nanoparticle with an average diameter of 150 nm or less was applied to this primer, and a nanoparticle was applied to a particle with amine functional group. The primer layer was formed by applying an adhesive strength improving agent manufactured in CZ series by MEC Inc.

In the seed layer/primer layer 21c, a part where the formation of an electrically conductive layer is necessary, or a part where it is unnecessary, was selectively processed to be an activated state or an inactivated state for metal plating. Light irradiation treatment such as laser light of a certain wavelength, etc., chemical treatment, and the like were applied to the processing to be an activated state or an inactivated state. A copper plating method applied to manufacturing a semiconductor element was applied to form the metal layer.

An etched layer 21e of a core distribution layer was formed by performing metal plating to form an electrically conductive layer as a predetermined pattern, after the seed layer is partially removed or processed to be inactivated. At a position of the minimum inner diameter of the core via, the electrically conductive layer was allowed to have a thickness of 97%, when a distance from an inner diameter surface of the core via to a surface of the electrically conductive layer is total 100%. Also, at an opening part where has a larger diameter between the first opening part and the second opening part, the electrically conductive layer was allowed to have a thickness of 97%, when a distance from an inner diameter surface of the core via to a surface of the electrically conductive layer is total 100%. Furthermore, an average distance between one surface of the electrically conductive layer near to an inner diameter surface of the core via and the inner diameter surface of the core via, was allowed to be 0.5 μm.

3-2) Insulation Layer Forming step: After forming the core distribution layer, which is an electrically conductive layer, an insulating layer forming step of filling the empty space with an insulating layer was performed. At this time, the one manufactured in the form of a film was applied to the applied insulating layer, and a method of pressure sensitive lamination of the insulating layer in the form of a film was applied.

4) Upper Layer Forming Step: A step of forming an upper distribution layer including an upper insulating layer and an upper distribution pattern on the core layer was performed. A method of laminating an insulating film as the upper insulating layer was performed, and a process of lamination and hardening of the insulating was performed. The upper insulating layer is also at least partially in direct contact with the glass substrate, and thus the one with a sufficient adhesive force was applied to. Specifically, the one having properties that satisfy an adhesion test value of 4B or more according to ASTM D3359, were applied to the glass substrate and the upper insulating layer The upper distribution pattern was formed by repeating the process of forming the insulating layer 23a, forming an electrically conductive layer 23c in a predetermined pattern, and etching unnecessary parts to form an etching layer 23d of an electrically conductive layer. In the case of an electrically conductive layer formed adjacent to each other with an insulating layer disposed therebetween, it was formed by a method of forming a blind via 23b in the insulating layer and then performing a plating process. For the formation of the blind via, a dry etching method such as laser etching and plasma etching, and a wet etching method using a masking layer and an etchant were applied to manufacture a packaging substrate.

Example 2—Manufacturing of a Packaging Substrate

A packaging substrate was manufactured in the same manner as in Example 1, except for changing the conditions in the Example 1 to 1.1 M hydrofluoric acid, and 80% ultrasonic output during etching.

Example 3—Manufacturing of a Packaging Substrate

A packaging substrate was manufactured in the same manner as in Example 1, except for changing the conditions in the Example 1 to 60% ultrasonic output during etching.

Comparative Example 1—Manufacturing of a Packaging Substrate

A packaging substrate was manufactured in the same manner as in Example 1, except for changing the conditions in the Example 1 to 3 M hydrofluoric acid, 1M nitric acid, and 20% ultrasonic output during etching.

Comparative Example 2—Manufacturing of a Packaging Substrate

A packaging substrate was manufactured in the same manner as in Example 1, except for changing the conditions in the Example 1 to 2 M nitric acid, and 10% ultrasonic output during etching.

Comparative Example 3—Manufacturing of a Packaging Substrate

A packaging substrate was manufactured in the same manner as in Example 1, except for changing the conditions in the Example 1 to 1.1 M hydrofluoric acid, and not processing ultrasonic during etching.

Experimental Example—Measurement of Core Via Distribution

The distribution of core via of the packaging substrate is evaluated based on a minimum inner diameter which is observed and measured by microscope in the cross-section, after dividing prepared samples into 9 compartments (3×3), and processing of cutting the samples of 5 areas of top left, bottom left, center, top right, and bottom right, and the results are shown in Table 1.

TABLE 1

| | Example 1 | Example 2 | Example 3 | Comparative Example 1 | Comparative Example 2 | Comparative Example 3 |
|---|---|---|---|---|---|---|
| Etching Condition | HF 2M HNO$_3$ 1.1M | HF 1.1M HNO$_3$ 1.1M | HF 2M HNO$_3$ 1.1M | HF 3M HNO$_3$ 1M | HF 2M HNO$_3$ 2M | HF 2M HNO$_3$ 1M |
| Ultrasonic Output(80 Hz) | 100% | 80% | 60% | 20% | 10% | 0% |
| $D_{50}/D_{90}$ | 0.83 or more | 0.9 or more | 0.9 or more | Less than 0.83 | — | Less than 0.83 |
| $D_{50}/D_{10}$ | 1.25 or less | 1.1 or less | 1.1 or less | — | More than 1.25 | — |
| The number of Core via per 1 cm$^2$ | 225 | 1024 | 2500 | 625 | 225 | 121 |

* $D_{50}$ is a value corresponding to 50% in the diameter distribution of the minimum inner diameter, $D_{90}$ is a value corresponding to 90% in the diameter distribution of the minimum inner diameter, and $D_{10}$ is a value corresponding to 10% in the diameter distribution of the minimum inner diameter.

Referring to Table 1, $D_{50}/D_{90}$ values were 0.83 or more, and values compared to $D_{10}$ were 1.25 or less in Examples 1 to 3, which were treated with an ultrasonic output of 80 Hz, and 60% or more, in the packaging substrate. It is considered that the packaging substrate having these characteristics can sufficiently smoothly transmit electrical signals to the elements respectively disposed above or below the packaging substrate.

The packaging substrate of the embodiment does not form a parasitic element which a glass substrate has, and with excellent characteristics such as being capable of serving as a supporting substrate which is thin and having sufficient strength, it forms an electrically conductive layer with an appropriate ratio of the thickness of the glass substrate, and thereby utilizes that excellent properties such as inducing efficient transmitting of signals.

A glass substrate is evaluated to have poor bonding properties with an electrically conductive layer such as a copper layer, and in order to stably form an electrically conductive layer, a uniform diameter distribution of the core via is required. When the diameter distribution of the core via is non-uniform beyond a certain level, it may be difficult to sufficiently form an electrically conductive layer in the core via, which may adversely affect the upper and lower electrical signal transmission rate of the packaging substrate.

Considering these characteristics, and for efficient electrical signal transmission, it is considered that the $D_{50}/D_{90}$ ratio of 0.83 or more, and the $D_{50}/D_{10}$ ratio of 1.25 or less is desirable.

Although the desirable examples of the embodiment have been described above, the scope of the embodiment is not limited thereto, and various modifications and alterations made by those skilled in the art using the basic concept of the embodiment defined in the following claims also fall within the scope of the embodiment.

DESCRIPTION OF FIGURE NUMBERS

| | |
|---|---|
| 100: Semiconductor apparatus | 10: Motherboard |
| 30: Semiconductor element unit | 32: First semiconductor element |
| 34: Second semiconductor element | 36: Third semiconductor element |
| 20: Packaging substrate | 22: Core layer |
| 223: Core insulating layer | 21, 21a: Glass substrate |
| 213: First surface | 214: Second surface |
| 23: Core via | 233: First opening part |
| 234: Second opening part | 235: Minimum inner diameter part |
| 24: Core distribution layer | 241: Core distribution pattern |
| 241a: First surface distribution pattern | 241b: Core via distribution pattern |
| 241c: Second surface distribution pattern | 26: Upper layer |
| 25: Upper distribution layer | 251: Upper distribution pattern |
| 252: Blind via | 253: Upper insulating layer |
| 27: Upper surface connecting layer | 271: Upper surface connecting electrode |
| 272: Upper surface connecting pattern | 29: Lower layer |
| 291: Lower distribution layer | 291a: Lower distribution pattern |
| 291b: Lower insulating layer | 292: Lower surface connecting pattern |
| 292a: Lower surface connecting electrode | 292b: Lower surface connecting pattern |
| 50: Connecting part | 51: Element connecting part |
| 52: Board connecting part | 60: Cover layer |
| 21b: Glass defect | 21c: Seed layer, Primer layer |
| 21d: Core distribution layer | 21e: Etched layer of Core distribution layer |
| 23a: Insulating layer | 23b: Etched layer of Insulating layer |
| 23c: Electrically conductive layer | 23d: Etched layer of Electrically conductive layer |
| 23e: Insulating layer | 23f: Etched layer of Insulating layer |
| 23g: Electrically conductive layer | 23h: Etched layer of Electrically conductive layer |

What is claimed is:

1. A packaging glass comprising:
a core layer and an upper layer,
wherein the core layer comprises a supporting substrate comprising a glass substrate with a first surface and a second surface facing each other, and comprising a core via penetrating through the first surface and the second surface; and
a core distribution layer comprising an electrically conductive layer respectively disposed on at least a part of the first surface and the second surface, and an electrically conductive layer which electrically connects them to each other through the core via;
wherein the upper layer comprises an electrically conductive layer disposed on the first surface and electrically connecting the core distribution layer and an element unit, and;
wherein an average inner diameter of a part with the minimum inner diameter within a core via formed on the glass substrate is 50 μm to 95 μm and satisfies the condition of Equation 1 below.

$$0.83 \times D_{90} \leq D_{50} \leq 1.25 \times D_{10}$$ [Equation 1]

In the Equation 1, $D_{50}$ is a value corresponding to 50% in the diameter distribution of the minimum inner diameter, $D_{90}$ is a value corresponding to 90% in the diameter distribution of the minimum inner diameter, and $D_{10}$ is a value corresponding to 10% in the diameter distribution of the minimum inner diameter.

2. The packaging substrate of claim 1,
wherein the core via satisfies the condition of Equation 1-1 below.

$$0.88 \times D_{90} \leq D_{50} \leq 1.18 \times D_{10}$$ [Equation 1-1]

In the Equation 1-1, $D_{50}$ is a value corresponding to 50% in the diameter distribution of the minimum inner diameter, $D_{90}$ is a value corresponding to 90% in the diameter distribution of the minimum inner diameter, and $D_{10}$ is a value corresponding to 10% in the diameter distribution of the minimum inner diameter.

3. The packaging substrate of claim 1,
wherein the core via has a first surface opening part diameter which is a diameter at an opening part in contact with the first surface and a second surface opening part diameter which is a diameter at an opening part in contact with the second surface, and
a target opening part which is a larger one between the first surface opening part diameter and the second surface opening part diameter, has an average diameter of 70 μm to 120 μm and satisfies the condition of Equation 2 below.

$$0.9 \times D_{90} \leq D_{50} \leq 1.1 \times D_{10} \quad \text{[Equation 2]}$$

In the Equation 2, $D_{50}$ is a value corresponding to 50% in the diameter distribution of a target opening part, $D_{90}$ is a value corresponding to 90% in the diameter distribution of a target opening part, and $D_{10}$ is a value corresponding to 10% in the diameter distribution of a target opening part.

4. The packaging substrate of claim 3,
wherein a target opening part which is a larger one between the first surface opening part diameter and the second surface opening part diameter, has an average diameter of 80 μm to 105 μm and satisfies the condition of Equation 2-1 below.

$$0.92 \times D_{90} \leq D_{50} \leq 1.08 \times D_{10} \quad \text{[Equation 2-1]}$$

In the Equation 2-1, $D_{50}$ is a value corresponding to 50% in the diameter distribution of a target opening part, $D_{90}$ is a value corresponding to 90% in the diameter distribution of a target opening part, and $D_{10}$ is a value corresponding to 10% in the diameter distribution of a target opening part.

5. The packaging substrate of claim 1,
wherein the core via is disposed in the number of 100 to 3000 based on a unit area (1 cm$^2$) of the glass substrate.

6. The packaging substrate of claim 1,
wherein when the entire length of the core via is 100%, a part with the minimum inner diameter is disposed at the point of 40 to 60% based on the first opening part.

7. The packaging substrate of claim 1,
wherein the core via is disposed at the glass substrate in a pitch of 1.2 mm or less.

8. The packaging substrate of claim 1,
wherein the core distribution layer comprises a core distribution pattern, which is an electrically conductive layer electrically connecting the first surface and the second surface of the glass substrate through a through-via; and
a core insulating layer surrounding the core distribution pattern.

9. The packaging substrate of claim 1,
wherein the packaging substrate has a thickness of about 2000 μm or less.

10. A semiconductor device comprising:
a semiconductor element unit where one or more semiconductor elements are disposed; and a packaging substrate electrically connected to the semiconductor element; and a motherboard electrically connected to the packaging substrate, transmitting electrical signals of the semiconductor element and external, and connecting each other;
wherein the packaging substrate is a packaging substrate of claim 1.

* * * * *